United States Patent
Kondo et al.

(10) Patent No.: US 10,308,787 B2
(45) Date of Patent: Jun. 4, 2019

(54) RESIN COMPOSITION, RESIN FILM, METHOD FOR PRODUCING RESIN FILM, METHOD FOR PRODUCING SEMICONDUCTOR DEVICE, AND SEMICONDUCTOR DEVICE

(71) Applicant: SHIN-ETSU CHEMICAL CO., LTD., Tokyo (JP)

(72) Inventors: Kazunori Kondo, Takasaki (JP); Yoichiro Ichioka, Annaka (JP); Michihiro Sugo, Takasaki (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 191 days.

(21) Appl. No.: 15/466,270

(22) Filed: Mar. 22, 2017

(65) Prior Publication Data

US 2017/0283581 A1   Oct. 5, 2017

(30) Foreign Application Priority Data

Apr. 5, 2016 (JP) .................................. 2016-75754
Jun. 30, 2016 (JP) ................................ 2016-130354

(51) Int. Cl.
| | | |
|---|---|---|
| C08G 77/14 | (2006.01) | |
| C08K 3/36 | (2006.01) | |
| C08J 5/18 | (2006.01) | |
| C09J 183/04 | (2006.01) | |
| H01L 21/683 | (2006.01) | |
| H01L 21/78 | (2006.01) | |
| C08G 59/32 | (2006.01) | |
| C08G 59/42 | (2006.01) | |
| C08G 59/50 | (2006.01) | |
| C08G 59/62 | (2006.01) | |
| C09D 183/10 | (2006.01) | |
| C09D 183/14 | (2006.01) | |
| C08L 83/10 | (2006.01) | |
| C08L 83/14 | (2006.01) | |
| H01L 23/29 | (2006.01) | |
| C08G 77/52 | (2006.01) | |
| C08G 77/455 | (2006.01) | |

(52) U.S. Cl.
CPC ............ *C08K 3/36* (2013.01); *C08G 59/3281* (2013.01); *C08G 59/4215* (2013.01); *C08G 59/5073* (2013.01); *C08G 59/621* (2013.01); *C08J 5/18* (2013.01); *C08L 83/10* (2013.01); *C08L 83/14* (2013.01); *C09D 183/10* (2013.01); *C09D 183/14* (2013.01); *C09J 183/04* (2013.01); *H01L 21/6836* (2013.01); *H01L 21/78* (2013.01); *H01L 23/296* (2013.01); *C08G 77/14* (2013.01); *C08G 77/455* (2013.01); *C08G 77/52* (2013.01); *C08J 2383/04* (2013.01); *H01L 2221/6834* (2013.01); *H01L 2221/68327* (2013.01)

(58) Field of Classification Search
CPC .......... C08K 3/36; C08L 83/10; C08L 83/14; C08G 77/14; C08G 59/3281
See application file for complete search history.

(56) References Cited

U.S. PATENT DOCUMENTS

| | | | |
|---|---|---|---|
| 3,159,601 A | 12/1964 | Ashby | |
| 3,159,662 A | 12/1964 | Ashby | |
| 3,220,972 A | 11/1965 | Lamoreaux | |
| 3,775,452 A | 11/1973 | Karstedt | |
| 7,163,986 B2 * | 1/2007 | Sugo ................... | C08G 77/455 525/431 |
| 7,256,248 B2 * | 8/2007 | Sugo ................... | C08G 73/125 528/26 |

(Continued)

FOREIGN PATENT DOCUMENTS

| EP | 1 484 353 A1 | 12/2004 |
|---|---|---|
| EP | 1484353 | * 12/2004 |

(Continued)

OTHER PUBLICATIONS

Aug. 28, 2017 Extended Search Report issued in European Patent Application No. 17000568.0.

*Primary Examiner* — Margaret G Moore
(74) *Attorney, Agent, or Firm* — Oliff PLC

(57) ABSTRACT

The present invention provides a resin composition including: (A) a silicone resin containing a constitutional unit shown by the following composition formula (1) and having a weight average molecular weight of 3,000 to 500,000, (B) an epoxy resin-curing agent; and (C) a filler. This can provide a resin composition and a resin film that can mold a wafer in a lump, has good molding properties particularly to a thin-film wafer having a large diameter, gives low-warping properties, as well as good wafer protection performance, good adhesion properties, high reliability, and good heat resistance after molding, can perform a molding process favorably, and can be used for wafer level packaging favorably. The present invention also provides a method for producing the resin film, a semiconductor device molded with the resin film, and a method for producing the semiconductor device.

(1)

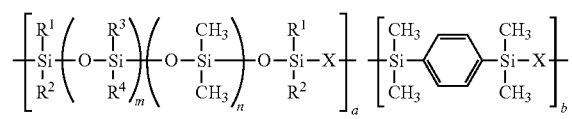

19 Claims, 1 Drawing Sheet

(56) References Cited

U.S. PATENT DOCUMENTS

| | | | |
|---|---|---|---|
| 2004/0242829 A1* | 12/2004 | Sugo | C08G 77/455 528/31 |
| 2011/0105646 A1 | 5/2011 | Kan et al. | |
| 2013/0113083 A1* | 5/2013 | Kondo | C08L 83/14 257/620 |
| 2017/0009022 A1 | 1/2017 | Kondo et al. | |
| 2018/0223049 A1* | 8/2018 | Maruyama | C08G 73/22 |

FOREIGN PATENT DOCUMENTS

| | | |
|---|---|---|
| JP | 2003-020337 A | 1/2003 |
| WO | 2009142065 A1 | 11/2009 |
| WO | 2015/111427 A1 | 7/2015 |

* cited by examiner (A)
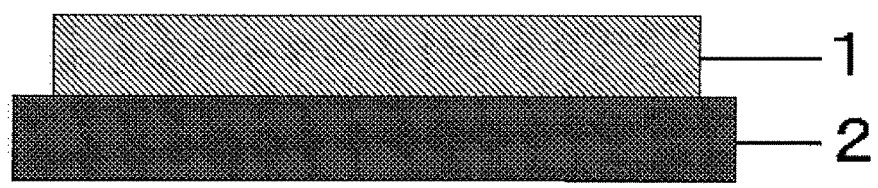
(B)
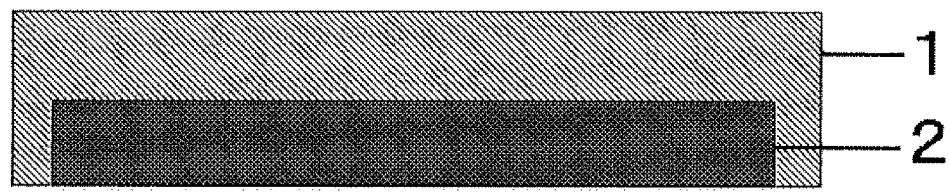

RESIN COMPOSITION, RESIN FILM, METHOD FOR PRODUCING RESIN FILM, METHOD FOR PRODUCING SEMICONDUCTOR DEVICE, AND SEMICONDUCTOR DEVICE

TECHNICAL FIELD

The present invention relates to a resin composition, resin film and a method for producing thereof, as well as a semiconductor device and a method for producing thereof.

BACKGROUND ART

With increasing in diameter and reducing in thickness of a size of a wafer for use in manufacture of a semiconductor device in recent years, a technology for sealing the wafer in a wafer level is demanded. Accordingly, in addition to a conventional transfer molding method using a solid type epoxy resin, a compression molding method using a liquid type epoxy resin has been suggested (Patent Literature 1).

However, since the resin is flowed in a narrow portion in the transfer molding, there is concern of occurrence of wire transformation, and a short shot involved by an increase in sealing area is apt to occur. Further, in the compression molding method, it is difficult to finely control the molding range on an end face portion of a wafer, and it is not easy to optimize fluidity and properties when flowing a liquid sealing resin into a molding machine. Moreover, warpage of a molded wafer, which has been unquestioned, becomes an issue due to increase in diameter of a wafer size and reduction in film thickness of a wafer in recent years, and excellent wafer protection property is demanded. Accordingly, it has been demanded to develop a wafer mold material that can mold a wafer in a lump without causing problems such as a short shot on a wafer surface, and gives low-warping properties, as well as good wafer protection properties, good adhesion properties, high reliability, and good heat resistance after molding.

CITATION LIST

Patent Literature

Patent Literature 1: WO 2009/142065

SUMMARY OF INVENTION

Technical Problem

The present invention was accomplished in view of the above-described problems. It is an object of the present invention to provide a resin composition and a resin film that can mold a wafer (wafer mold) in a lump, has good molding properties particularly to a thin-film wafer having a large diameter, gives low-warping properties, as well as good wafer protection properties, good adhesion properties, high reliability, and good heat resistance after molding, can perform a molding process favorably, and can be used for wafer level packaging; and to provide a method for producing the resin film, a semiconductor device molded with the resin film, and a method for producing the semiconductor device.

Solution to Problem

To solve the foregoing problems, the present invention provides a resin composition comprising:

(A) a silicone resin containing a constitutional unit shown by the following composition formula (1) and having a weight average molecular weight of 3,000 to 500,000,

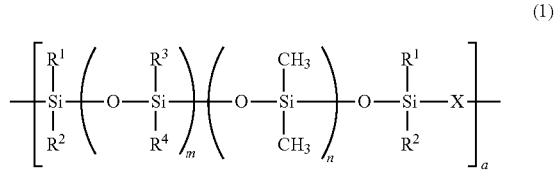

(1)

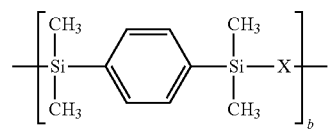

[wherein $R^1$ to $R^4$ each independently represent a monovalent hydrocarbon group having 1 to 8 carbon atoms, with the proviso that the both of $R^3$ and $R^4$ are not methyl groups at the same time; "m" and "n" are each independently an integer of 0 to 300; the both of "a" and "b" are positive numbers satisfying a+b=1; each of "X" independently represents a linking group selected from the divalent groups shown by the following general formulae (2), (3), (4), and (5), and when the molar numbers of units shown by the following general formulae (2), (3), (4), and (5) contained in the silicone resin (A) are defined as "c", "d", "e", and "f" respectively, "e" is a positive number, each of "c", "d", and "f" is 0 or a positive number satisfying c+d+e+f/the molar number of the linking group shown by "X" contained in the silicone resin (A)=1, and having a ratio to "e" in a range of c+d=1 to 10 and f=0 to 1 when the "e" is assumed to be 1;

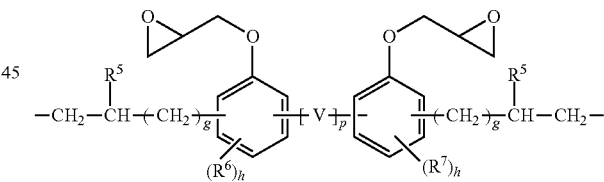

(2)

(wherein "V" is a divalent organic group selected from the following

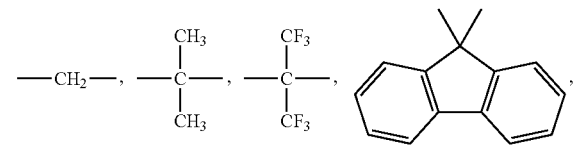

"p" is 0 or 1, $R^5$ represents a hydrogen atom or a methyl group, "g" is an integer of 0 to 7, $R^6$ and $R^7$ each independently represent the same or different group selected from alkyl groups and alkoxy groups having 1 to 4 carbon atoms, and "h" is any of 0, 1, and 2),

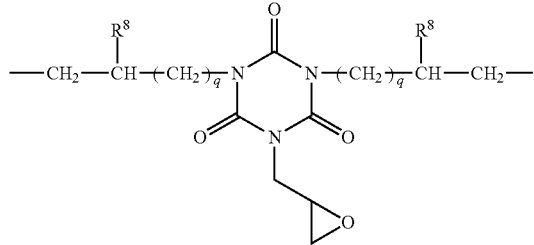
(wherein $R^8$ represents a hydrogen atom or a methyl group, and "q" is an integer of 0 to 7),
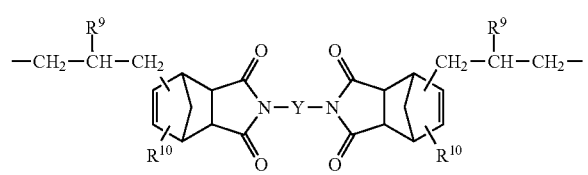
(wherein "Y" is a divalent group selected from the following
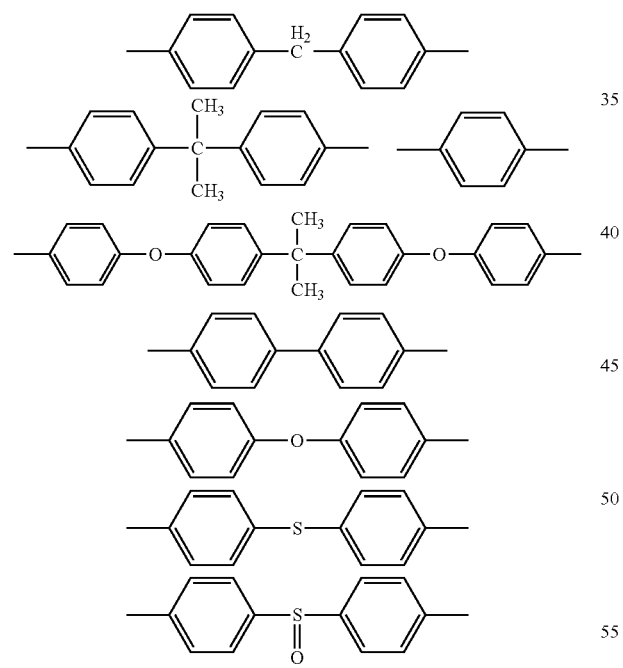
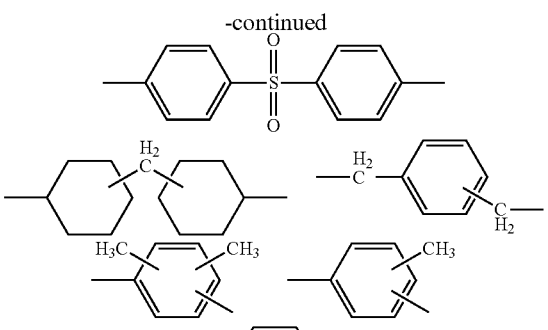
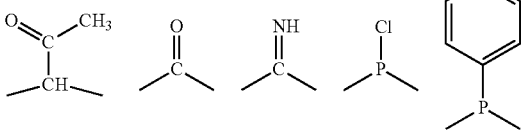
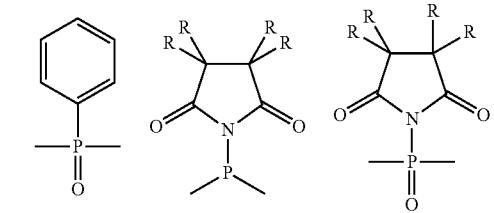
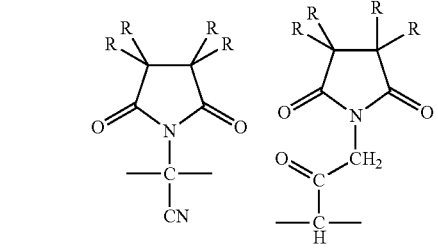
(wherein "R" each independently represent a hydrogen atom or a methyl group), and $R^9$ and $R^{10}$ each independently represent a hydrogen atom or a methyl group),
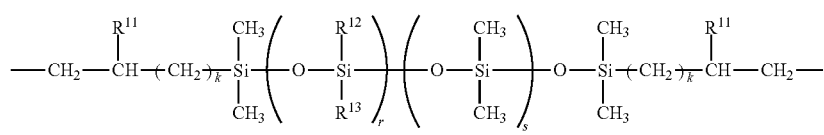

(wherein $R^{12}$ and $R^{13}$ each independently represent a monovalent hydrocarbon group having 1 to 8 carbon atoms, with the proviso that the both of $R^{12}$ and $R^{13}$ are not methyl groups at the same time, "r" and "s" are each independently an integer of 0 to 300, $R^{11}$ represents a hydrogen atom or a methyl group, and "k" is an integer of 0 to 7)];

(B) an epoxy resin-curing agent; and (C) a filler.

The resin composition comprising such a characteristic silicone resin (A) can be formed into a film-like form. Accordingly, it can mold a wafer (wafer molding) in a lump and has good molding properties particularly to a thin-film wafer having a large diameter, and after molding, the resin composition becomes excellent in adhesion properties, low-warping properties, wafer protection performance, reliability, and heat resistance, and can be used for wafer level packaging favorably.

It is preferable that the "Y" be a divalent group selected from the following

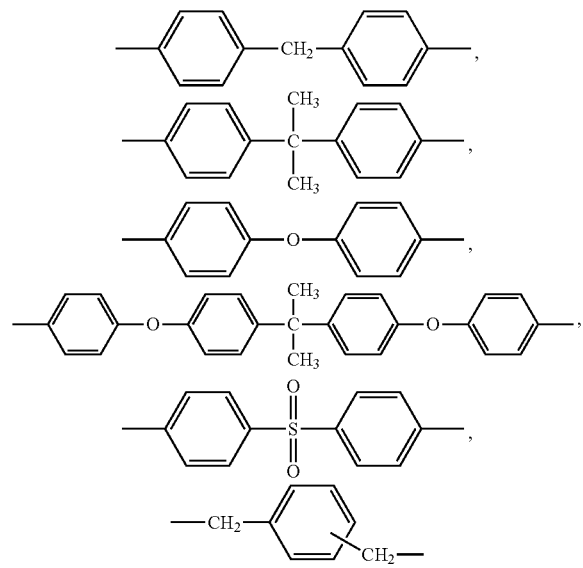

in the general formula (4).

Such a resin composition comprising the silicone resin (A) in which "Y" is any of the foregoing bonding group can be easily formed into a film-like form. Accordingly, it can easily mold a wafer in a lump and has better molding properties particularly to a thin-film wafer having a large diameter, and after molding, the resin composition becomes excellent in adhesion properties, low-warping properties, wafer protection performance, reliability, and heat resistance much more, and can be used for wafer level packaging more favorably.

It is preferable that the component (B) be any of an amine-based epoxy resin-curing agent, a phenol-based epoxy resin-curing agent, and an acid anhydride-based epoxy resin-curing agent.

Such a resin composition comprising the epoxy resin-curing agent of the component (B) can be easily formed into a film-like form. Accordingly, it can easily mold a wafer in a lump and has better molding properties particularly to a thin-film wafer having a large diameter, and after molding, the resin composition becomes excellent in adhesion properties, low-warping properties, wafer protection performance, reliability, and heat resistance much more, and can be used for wafer level packaging more favorably.

It is preferable that the amount of the component (B) be 5 to 50 parts by mass based on 100 parts by mass of the component (A), and the mass fraction of the component (C) be 50 to 95% by mass based on the total mass.

Such a resin composition can be easily formed into a film-like form. Accordingly, it can easily mold a wafer in a lump and has better molding properties particularly to a thin-film wafer having a large diameter, and after molding, the resin composition becomes excellent in adhesion properties, low-warping properties, wafer protection performance, reliability, and heat resistance much more, and can be used for wafer level packaging more favorably.

It is preferable that the inventive resin composition further comprise an epoxy resin-curing accelerator.

The inventive resin composition becomes further excellent in adhesion properties to wafers and wafer protection performance by containing the epoxy resin-curing accelerator, and can be used for wafer level packaging more favorably thereby.

It is preferable that the inventive resin composition further comprise an epoxy resin other than the component (A).

The inventive resin composition can further improve the adhesion properties to wafers and the wafer protection performance by containing the epoxy resin other than the component (A).

It is also preferable that the component (C) be silica.

Such a resin composition in which the filler of the component (C) is silica can further improve the wafer protection performance. It is also possible to further improve the heat resistance, the humidity resistance, strength, etc. to improve the reliability much more.

The present invention also provides a resin film made from the foregoing resin composition.

Such a resin film formed into a film-like form has a good molding properties to wafers, particularly to a thin-film wafer having a large diameter, and does not cause a problem such as a short shot since it is not necessary to flow a resin when a wafer is molded in a lump. The resin film made from the inventive resin composition can be a wafer mold material that gives good adhesion properties to wafers, wafer protection performance, low-warping properties, reliability, and heat resistance.

The present invention provides a method for producing a resin film comprising:

coating a delamination film with the foregoing resin composition to produce two or more resin-formed films each having a resin composition layer on the delamination film, and superimposing the resin composition layers of the two or more resin-formed films with each other.

In this case, it is preferable that at least one of the resin-formed films have a protective film for protecting the resin composition layer in such a way that the resin composition layer and the protective film are successively formed on the delamination film, and the superimposing of the resin composition layers of the resin-formed films be performed such that the protective film or the delamination film is removed from each of the resin-formed films so as to expose the resin composition layer to be laminated with each other, and the exposed resin composition layers are superimposed with each other.

Such a method for producing a resin film can easily produce a composite resin film composed of multiple layers of resin films.

The present invention also provides a method for producing a semiconductor device, comprising the steps of:

adhering the foregoing resin film to a semiconductor wafer to mold the semiconductor wafer with the resin film, and dividing the molded semiconductor wafer into individual pieces.

Such a semiconductor wafer molded with the resin film can have reduced warpage and can be protected sufficiently. Accordingly, by dividing this into individual pieces, a high quality semiconductor device can be produced in high yield.

The present invention also provides a semiconductor device, wherein the device is a division piece of a semiconductor wafer molded with a heat cured film of the foregoing resin film.

Such a semiconductor wafer molded with a heat cured film of the resin film is a sufficiently protected wafer with reduced warpage. Accordingly, this is a high quality semiconductor device without warpage by dividing the wafer into pieces.

Advantageous Effects of Invention

The inventive resin composition can be processed into a film-like form, and has good molding properties, particularly to a thin-film wafer having a large diameter thereby. After molding, the resin composition becomes excellent in adhesion properties, low-warping properties, wafer protection performance, reliability, and heat resistance. The resin composition can also mold a wafer in a lump, and becomes a resin film that can be favorably used for wafer level packaging thereby. The inventive method for producing a resin film can easily produce a resin film composed of multiple layers. The inventive semiconductor device and the method for producing thereof can provide a high quality semiconductor device in high yield.

BRIEF DESCRIPTION OF DRAWINGS

FIG. 1 (A) is a cross sectional view showing an example of a wafer molded with the inventive resin composition in a lump; (B) is a cross sectional view showing another example of a wafer molded with the inventive resin composition in a lump.

DESCRIPTION OF EMBODIMENTS

As described above, it has been demanded recently to develop a wafer mold material that can mold a wafer in a lump without causing problems such as a short shot on a wafer surface, and after molding, gives good adhesion properties, low-warping properties, good wafer protection performance, high reliability, and good heat resistance.

Accordingly, the present inventors diligently study to accomplish the foregoing subjects and consequently found that the combination of (A) the following silicone resin and (B) the following epoxy resin-curing agent gives a resin composition that is excellent in adhesion properties to wafers, low-warping properties and heat resistance after the curing; and that (C) the following filler improves wafer protection performance and reliability of a cured resin composition, and accordingly the resin film formed from a resin composition composed of these components can be a wafer mold material that has adhesion properties to wafers, wafer protection performance, low-warping properties, reliability, and heat resistance; thereby brought the present invention to completion.

Hereinafter, the resin composition, the resin film (the composite film) made from the resin composition and the method for producing thereof, the semiconductor device and the method for producing thereof of the present invention will be specifically described, but the present invention is not limited thereto.

The inventive resin composition is a resin composition comprising (A) the following silicone resin, (B) the following epoxy resin-curing agent, and (C) a filler.

[(A) Silicone Resin]

In the present invention, the silicone resin of the component (A) functions as to give film-formability. When the obtained resin film is used as a wafer mold material, adhesion properties to wafers, low-warping properties, good molding properties, and heat resistance can be provided.

The silicone resin of this component (A) is a silicone resin containing a constitutional unit shown by the following composition formula (1) and having a weight average molecular weight of 3,000 to 500,000,

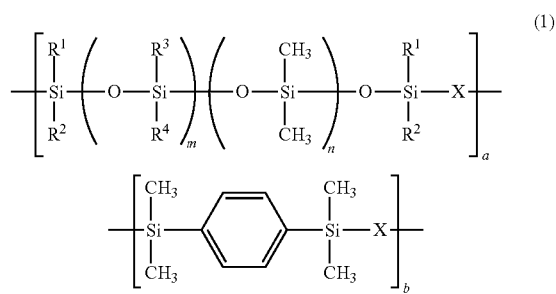

[wherein $R^1$ to $R^4$ each independently represent a monovalent hydrocarbon group having 1 to 8 carbon atoms, with the proviso that the both of $R^3$ and $R^4$ are not methyl groups at the same time; "m" and "n" are each independently an integer of 0 to 300; the both of "a" and "b" are positive numbers satisfying a+b=1; each of "X" independently represents a linking group selected from the divalent groups shown by the following general formulae (2), (3), (4), and (5), and when the molar numbers of units shown by the following general formulae (2), (3), (4), and (5) contained in the silicone resin (A) are defined as "c", "d", "e", and "f" respectively, "e" is a positive number, each of "c", "d", and "f" is 0 or a positive number satisfying c+d+e+f/the molar number of the linking group shown by "X" contained in the silicone resin (A)=1, and having a ratio to "e" in a range of c+d=1 to 10 and f=0 to 1 when the "e" is assumed to be 1;

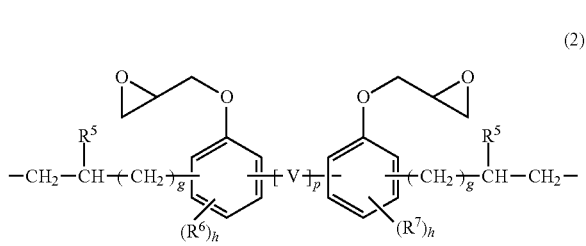

(wherein "V" is a divalent organic group selected from the following

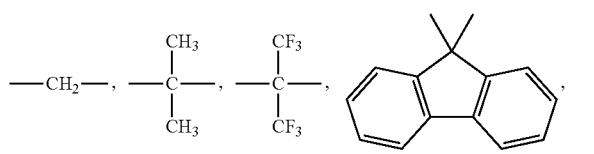

"p" is 0 or 1, $R^5$ represents a hydrogen atom or a methyl group, "g" is an integer of 0 to 7, $R^6$ and $R^7$ each independently represent the same or different group selected from alkyl groups and alkoxy groups having 1 to 4 carbon atoms, and "h" is any of 0, 1, and 2), (3)

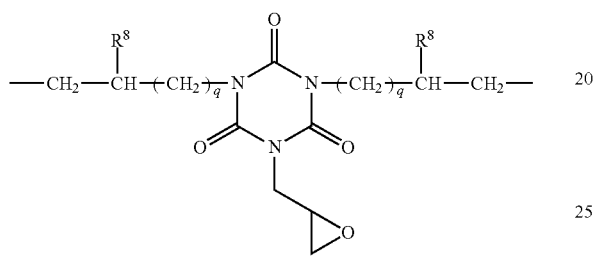

(wherein $R^8$ represents a hydrogen atom or a methyl group, and "q" is an integer of 0 to 7), (4)

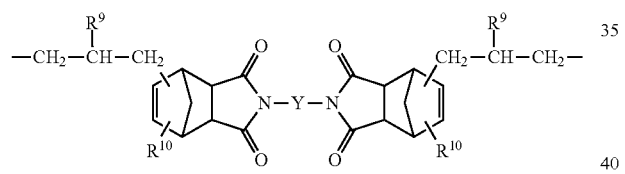

(wherein "Y" is a divalent group selected from the following

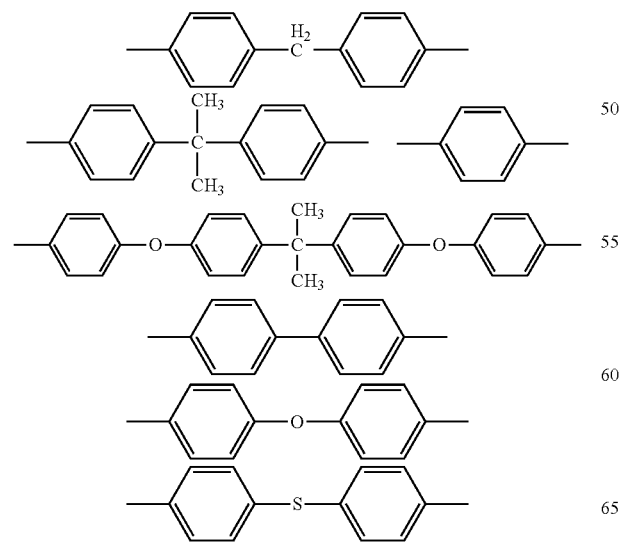

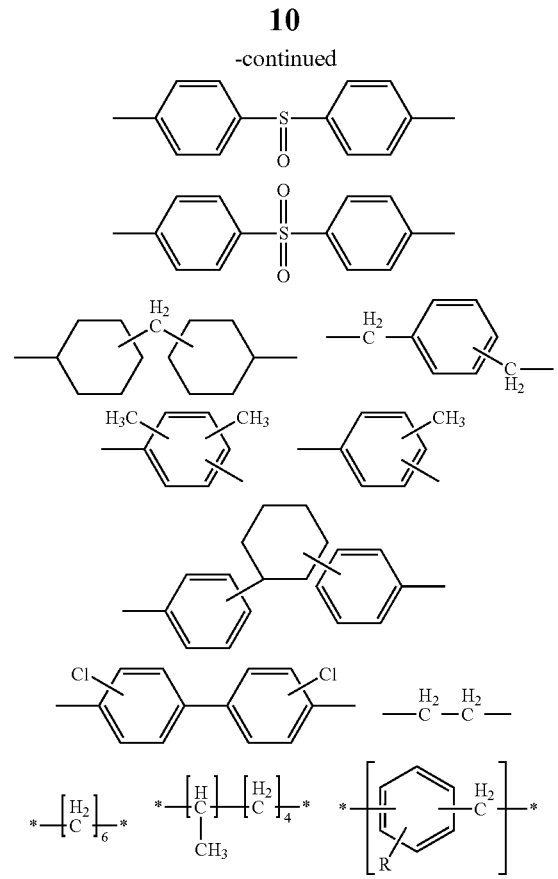

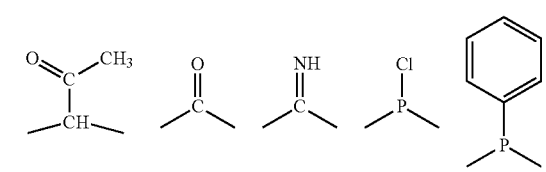

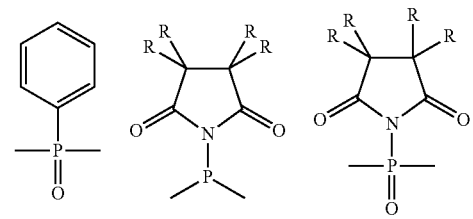

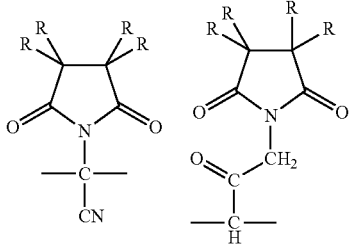

(wherein "R" each independently represent a hydrogen atom or a methyl group), and $R^9$ and $R^{10}$ each independently represent a hydrogen atom or a methyl group),

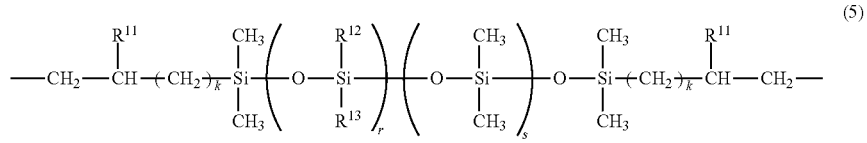

(wherein $R^{12}$ and $R^{13}$ each independently represent a monovalent hydrocarbon group having 1 to 8 carbon atoms, with the proviso that the both of $R^{12}$ and $R^{13}$ are not methyl groups at the same time, "r" and "s" are each independently an integer of 0 to 300, $R^{11}$ represents a hydrogen atom or a methyl group, and "k" is an integer of 0 to 7)].

The silicone resin (A) used for the present invention is a polymer that contains the repeating unit shown by the foregoing formula (1) and has a weight average molecular weight of 3,000 to 500,000, preferably 5,000 to 200,000, which is measured by gel permeation chromatography (GPC) in terms of polystyrene with tetrahydrofuran eluent.

"a" and "b" represent molar ratios of each repeating unit in the silicone resin (A). Both of them are positive numbers satisfying a+b=1, and preferably 0.05≤a≤0.8, particularly 0.1≤a≤0.7, and preferably 0.2≤b≤0.95, particularly 0.3≤b≤0.9. Each unit may be bound randomly or bound as a block copolymer.

In the formula (1), "m" and "n" are each independently an integer of 0 to 300; "m" is preferably 0 to 200, particularly 0 to 100; and "n" is preferably 0 to 200, particularly 0 to 100.

Each of "X" independently represents a linking group selected from the divalent groups shown by the foregoing formulae (2), (3), (4), and (5); and when the molar numbers of units shown by the general formulae (2), (3), (4), and (5) are defined as "c", "d", "e", and "f" respectively, "e" is a positive number, each of "c", "d", and "f" is 0 or a positive number satisfying c+d+e+f/the molar number of the linking group shown by "X" contained in the silicone resin (A)=1, and having a ratio to "e" in a range of c+d=1 to 10, preferably c+d=2 to 10, and f=0 to 1, preferably f=0 to 0.5 when the "e" is assumed to be 1.

Each of $R^1$ to $R^4$ independently represents a monovalent hydrocarbon group having 1 to 8 carbon atoms, preferably 1 to 6 carbon atoms. Illustrative examples thereof include an alkyl group, a cycloalkyl group, an aryl group; such as a methyl group, an ethyl group, a propyl group, a hexyl group, a cyclohexyl group, and a phenyl group. Among them, a methyl group and a phenyl group are preferable since they are easily available. Provided that the both of $R^3$ and $R^4$ are not methyl groups at the same time.

In the formula (2), $R^5$ represents a hydrogen atom or a methyl group; and $R^6$ and $R^7$ each independently represent an alkyl group or an alkoxy groups having 1 to 4 carbon atoms, which may be same or different. Illustrative examples of $R^6$ and $R^7$ include a methyl group, an ethyl group, a propyl group, a butyl group, a methoxy group, an ethoxy group, a propoxy group, a butoxy group, etc.; "g" is an integer of 0 to 7, "p" is 0 or 1, and "h" is any of 0, 1, and 2.

In the formula (3), $R^8$ represents a hydrogen atom or a methyl group, and "q" is an integer of 0 to 7. In the formula (4), $R^9$ and $R^{10}$ each independently represent a hydrogen atom or a methyl group.

Among the foregoing groups of "Y" in the formula (4), any of the linking groups selected from the following are desirable.

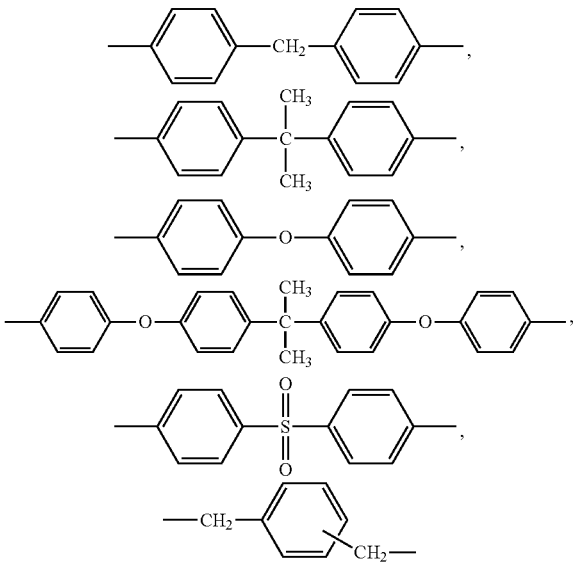

In the formula (5), $R^{12}$ and $R^{13}$ each independently represent a monovalent hydrocarbon group having 1 to 8 carbon atoms, with the proviso that the both of $R^{12}$ and $R^{13}$ are not methyl groups at the same time. "r" and "s" are each independently an integer of 0 to 300; "r" is preferably 0 to 200, particularly 0 to 100; and "s" is preferably 0 to 200, particularly 0 to 100. $R^{11}$ represents a hydrogen atom or a methyl group, and "k" is an integer of 0 to 7.

[Production Method of (A) Silicone Resin]

The silicone resin (A) in the present invention can be produced by addition polymerization under a metal catalyst by using compounds selected from the compounds shown by the following general formula (6), the following general formula (7), the following general formula (8), the following general formula (9), the following general formula (10), and the following general formula (11);

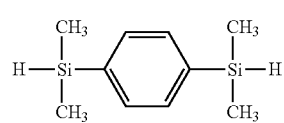

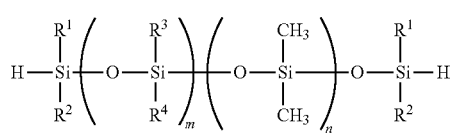

(wherein $R^1$ to $R^4$ each independently represent a monovalent hydrocarbon group having 1 to 8 carbon atoms, with the proviso that the both of $R^3$ and $R^4$ are not methyl groups at the same time; "m" and "n" are each independently an integer of 0 to 300);

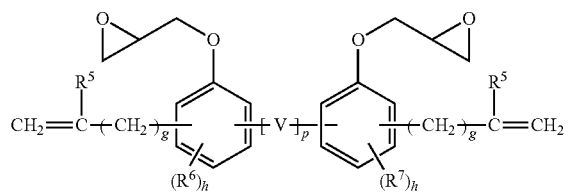
(8)

(wherein "V" is a divalent organic group selected from the following

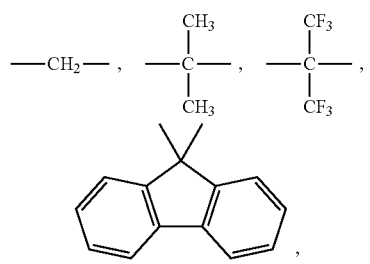

"p" is 0 or 1, $R^5$ represents a hydrogen atom or a methyl group, "g" is an integer of 0 to 7, $R^6$ and $R^7$ each independently represent the same or different group selected from alkyl groups and alkoxy groups having 1 to 4 carbon atoms, and "h" is any of 0, 1, and 2),

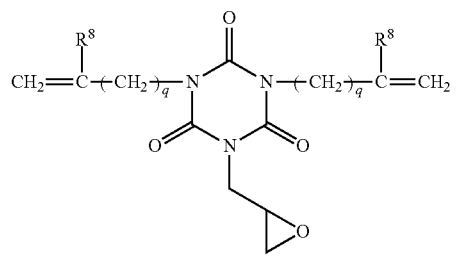
(9)

(wherein $R^8$ represents a hydrogen atom or a methyl group, and "q" is an integer of 0 to 7),

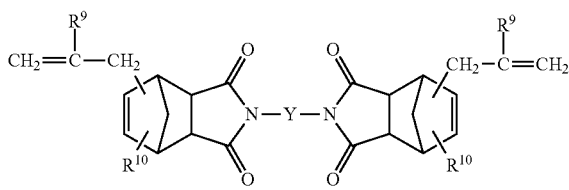
(10)

(wherein "Y" is a divalent group selected from the following

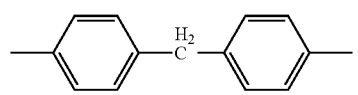

-continued

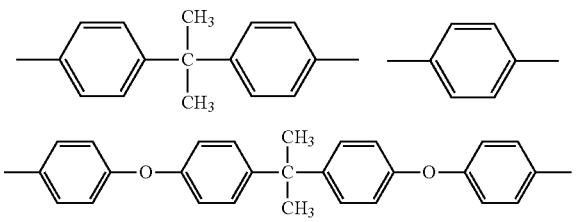

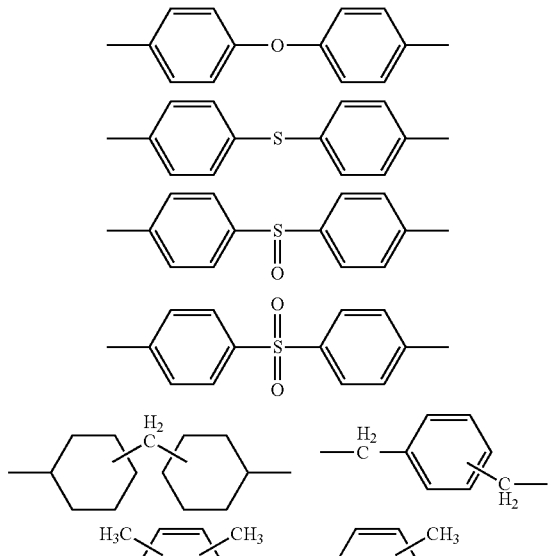

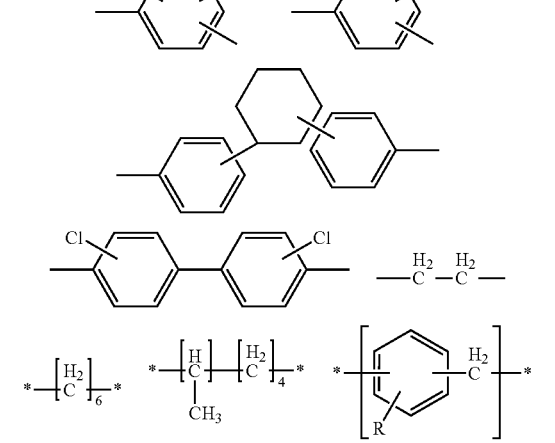

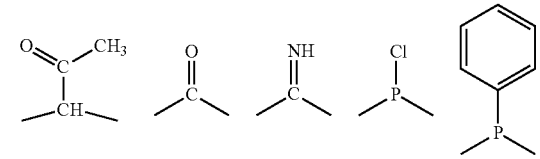

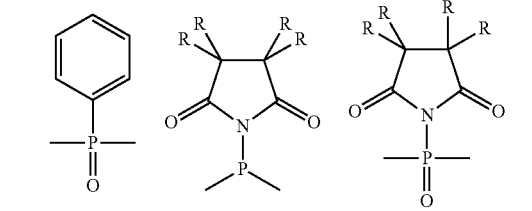

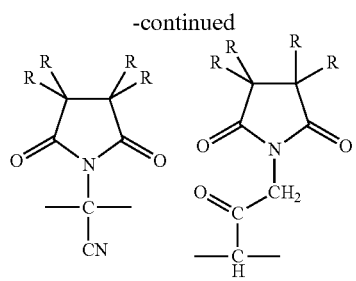

(wherein "R" each independently represent a hydrogen atom or a methyl group), and $R^9$ and $R^{10}$ each independently represent a hydrogen atom or a methyl group),

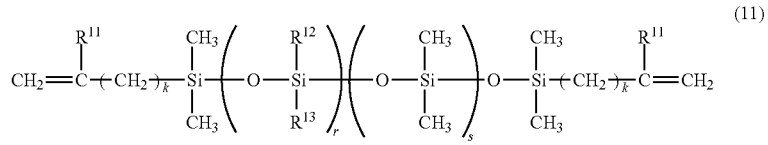

(wherein $R^{12}$ and $R^{13}$ each independently represent a monovalent hydrocarbon group having 1 to 8 carbon atoms, with the proviso that the both of $R^{12}$ and $R^{13}$ are not methyl groups at the same time, "r" and "s" are each independently an integer of 0 to 300, $R^{11}$ represents a hydrogen atom or a methyl group, and "k" is an integer of 0 to 7).

The metal catalyst that can be used include a platinum group metal simple substance such as platinum (including platinum black), rhodium, and palladium; platinum chloride, a chloroplatinic acid, and chloroplatinate such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$, and $Na_2HPtCl_4 \cdot xH_2O$ (in the formula, "x" is preferably an integer of 0 to 6, particularly 0 or 6); an alcohol-modified chloroplatinic acid (e.g., described in U.S. Pat. No. 3,220,972); a complex of a chloroplatinic acid and olefin (e.g., described in U.S. Pat. No. 3,159,601, 3,159,662, and 3,775,452); a material obtained by supporting a platinum group metal such as platinum black and palladium on a carrier such as alumina, silica, or carbon; a rhodium-olefin complex; chlorotris(triphenylphosphine) rhodium (a so-called Wilkinson's catalyst); and a complex of platinum chloride, a chloroplatinic acid, or chloroplatinate and vinyl group-containing siloxane (vinyl group-containing cyclic siloxane in particular).

The amount of the catalyst may be a catalytic amount, and preferably 0.0001 to 0.1% by mass, particularly 0.001 to 0.01% by mass of the platinum group metal per a total amount of the raw material compounds used for the reaction. The addition reaction can be performed without solvent, but solvent may be used in accordance with needs. As the solvent, hydrocarbon solvents such as toluene and xylene are preferable. The reaction temperature may be a temperature that enables the polymerization to complete in a short time without inactivating the catalyst, and is preferably 40 to 150° C., particularly 60 to 120° C., for example. The reaction time may be appropriately selected in accordance with the type and amount of the polymer, and is preferably 0.5 to 100 hours, particularly 0.5 to 30 hours, for example. In case of using solvent, vacuum evaporation is carried out to remove the solvent after finishing the reaction.

The reaction method is not particularly limited. For example, when reacting a compound shown by formula (6), a compound shown by formula (7), a compound shown by formula (8), and a compound shown by formula (10), it is preferable to adopt a method in which the compounds shown by formula (8) and formula (10) are mixed and warmed at first, followed by an addition of a metal catalyst to the mixture, and then compounds shown by formula (6) and formula (7) are added dropwise over 0.1 to 5 hours.

Each compound is preferably formulated in such a ratio that the total molar amount of hydrosilyl groups contained in the compounds shown by the formula (6) and the formula (7) based on the total molar amount of alkenyl groups contained in the compounds shown by the formula (8), the formula (9), formula (10), and formula (11) is 0.67 to 1.67, particularly 0.83 to 1.25. The weight average molecular weight of the polymer can be controlled by using a monoallyl compound such as o-allylphenol, or monohydrosilane such as triethylhydrosilane or monohydrosiloxane as a molecular weight modifier.

[(B) Epoxy Resin-Curing Agent]

The component (B) is a component for crosslinking reaction with (A) the silicone resin having epoxy groups. An addition of the component (B) improves the resin in its adhesion properties to wafers, wafer protection performance, and reliability. In the present invention, the epoxy resin-curing agent can be any material generally used for curing epoxy resins, and is not particularly limited. However, aromatic type curing agents and alicyclic type curing agents are more preferable in view of heat resistance.

Illustrative examples of the epoxy resin-curing agent include an amine-based epoxy resin-curing agent, a phenol-based epoxy resin-curing agent, an acid anhydride-based epoxy resin-curing agent, and a boron trifluoride-amine complex salt. It is particularly preferable that the epoxy resin-curing agent is any of an amine type, a phenol type, and an acid anhydride type. The epoxy resin-curing agent may be used alone, or in combination of two or more kinds.

The amine-based curing agent may include, for example, an aliphatic amine curing agent such as diethylenetriamine, triethylenetetramine and tetraethylenepentamine; an alicyclic amine curing agent such as isophorone diamine; an aromatic amine curing agent such as diaminodiphenylmethane and phenylenediamine; and dicyanediamide.

As the epoxy resin-curing agent, a phenol-based epoxy resin-curing agent can be used. The phenol-based epoxy resin-curing agent may include, for example, a resol type phenol resin and/or a novolak type phenol resin prepared by using phenol, bisphenol A and/or an alkyl phenol such as p-tert-butylphenol, octylphenol, p-cumylphenol; p-phenylphenol, cresol, etc. as a starting material.

The acid anhydride-based curing agent may include, for example, phthalic anhydride, pyromellitic anhydride, trimellitic anhydride, and hexahydrophthalic anhydride.

The formulation amount of (B) the epoxy resin-curing agent is not particularly limited, and preferably 5 to 50 parts by mass, more preferably 5 to 45 parts by mass based on 100 parts by mass of the component (A). When the formulation amount of the epoxy resin-curing agent is in the foregoing range, the adhesion properties and wafer protection performance of the resin composition are further improved, and the resin composition makes a cured material with excellent reliability.

[(C) Filler]

The component (C) gives wafer protection performance to the inventive resin composition, and can improve the heat resistance, the humidity resistance, strength, etc. to enhance the reliability. The filler may include, for example, a silicate such as talc, calcined clay, uncalcined clay, mica, and glass; oxide such as titanium oxide, alumina, fused silica (fused spherical silica, fused pulverized silica), and powder of crystalline silica; carbonate such as calcium carbonate, magnesium carbonate and hydrotalcite; hydroxide such as aluminum hydroxide, magnesium hydroxide, and calcium hydroxide; sulfate or sulfite such as barium sulfate, calcium sulfate, and calcium sulfite; borate such as zinc borate, barium metaborate, aluminum borate, calcium borate, and sodium borate; nitride such as aluminum nitride, boron nitride, and silicon nitride. These fillers may be used alone, or in combination of two or more kinds.

Among them, silica powder including fused silica and crystalline silica are preferable. Illustrative examples of the silica powder include reinforcing silica such as fumed silica and precipitated silica, and crystalline silica such as quartz; specifically, Aerosil R972, R974, and R976 product of NIPPON AEROSIL CO., LTD.; SE-2050, SC-2050, SE-1050, SO-E1, SO-C1, SO-E2, SO-C2, SO-E3, SO-C3, SO-E5, and SO-05 product of Admatechs Company Limited; Musil120A and Musil130A product of Shin-Etsu Chemical Co., Ltd.

The average particle size of the filler is not particularly limited, and is preferably 0.01 μm or more and 20 μm or less, particularly preferably 0.01 μm or more and 10 μm or less. When the average particle size of the filler is 0.01 μm or more, the filler is hard to aggregate, and the strength of the cured product is enhanced. The average particle size of 20 μm or less improves the performance of the film and enhance the fluidity of the resin into gap between chips to improve the loading property. Incidentally, the average particle size can be measured as a mass-average value $D_{50}$ (i.e., a particle size or a median diameter when a cumulative mass is 50%) with a particle size distribution measuring device by a laser diffraction method.

The content of the filler is preferably 50% by mass or more and 95% by mass or less, particularly 60% by mass or more and 92% by mass or less based on the total mass of the inventive resin composition. The filler content of 95% by mass or less improves the performance of the film and enhance the fluidity of the resin to improve the loading property. When the filler content is 50% by mass or more, the filler exhibits its effect sufficiently.

Epoxy Resin-Curing Accelerator

The inventive resin composition can further comprise an epoxy resin-curing accelerator in addition to the epoxy resin-curing agent. The containing of the epoxy resin-curing accelerator can proceed the curing reaction appropriately and uniformly. The formulation amount of the epoxy resin-curing accelerator is preferably 0.1 to 10 parts by mass, particularly 0.2 to 5 parts by mass based on 100 parts by mass of the component (A).

The epoxy resin-curing accelerator may include, for example, imidazole compounds such as 2-methylimidazole, 2-ethylimidazole, 2-ethyl-4-methylimidazole, an ethyl-isocyanate compound of these compounds, 2-phenylimidazole, 2-phenyl-4-methylimidazole, 2-phenyl-4-methyl-5-hydroxy-methylimidazole, and 2-phenyl-4,5-dihydroxymethylimidazole; 1,8-diazabicyclo(5.4.0)undecene-7 (DBU), 1,5-diazabicyclo(4.3.0)nonene-5 (DBN), DBU based compounds such as an organic acid salt of DBU, a phenol resin salt of DBU, and a tetraphenylborate of DBU derivatives; triorganophosphines and quaternary phosphonium salts such as triphenylphosphine, tributylphosphine, tris(p-methylphenyl)phosphine, tris(p-methoxyphenyl)phosphine, tris(p-ethoxyphenyl)phosphine, triphenylphosphine triphenylborate, and tetraphenylphosphine tetraphenylborate; tertiary amines such as triethylene ammonium.triphenyl borate, and its corresponding tetraphenylborate. These epoxy resin-curing accelerators may be used alone, or in combination of two or more kinds.

Epoxy Resin

The inventive resin composition can further comprise an epoxy resin other than the component (A) in order to improve adhesion properties to wafers and wafer protection performance. The epoxy resin undergoes crosslinking reaction with (B) the epoxy resin-curing agent together with (A) the silicone resin to further improve adhesion properties of the resin to wafers, wafer protection performance, and reliability thereby.

The epoxy resin may include, for example, a glycidyl ether type epoxy resin such as a bisphenol A type epoxy resin, a bisphenol F type epoxy resin, or a hydrogenated product thereof, a phenol-novolak type epoxy resin, and a cresol novolak type epoxy resin; a glycidyl ester type epoxy resin such as a hexahydrophthalic acid glycidyl ester and a dimer acid glycidyl ester; and a glycidylamine based epoxy resin such as triglycidyl isocyanurate and tetraglycidyl diaminodiphenylmethane; preferably a bisphenol A type epoxy resin, a bisphenol F type epoxy resin, a phenol novolak type epoxy resin, and a cresol novolak type epoxy resin. Commercially available products thereof may include, for example, in trade name, jER1001 (product of Mitsubishi Chemical Corporation), Epiclon 830S (product of DIC CORPORATION), jER517 (product of Mitsubishi Chemical Corporation), and EOCN103S (product of NIPPON KAYAKU Co., Ltd.).

The formulation amount of the epoxy resin is, when it is formulated, preferably 1 to 50 parts by mass, particularly 2 to 30 parts by mass based on 100 parts by mass of the component (A).

Silane Coupling Agent

The inventive resin composition may contain a silane coupling agent. The addition of the silane coupling agent can further improve the adhesion properties of the resin composition to a body to be adhered (wafer).

The silane coupling agent may include an epoxysilane coupling agent and an aminosilane coupling agent having an aromatic group. These may be used alone, or in combination of two or more kinds. The content of the silane coupling agent is not particularly limited, and is, when it is formulated, preferably 0.01% by mass or more and 5% by mass or less based on the total mass of the inventive resin composition.

The inventive resin composition may also contain components other than the foregoing ones. For example, various additives may be appropriately added to improve compatibility of (A) the silicone resin and (B) the epoxy resin-curing agent, or to improve various properties of the resin composition such as storage stability or workability. Examples thereof may include an internal release agent such as a fatty acid ester, a glyceric acid ester, zinc stearate, and calcium stearate; and a phenol base, phosphorus base or sulfur base antioxidant.

Organic Solvent

Organic solvent can be used as another optional component. That is, the inventive resin composition may be used without solvent or may be dissolved or dispersed into organic solvent to prepare a solution or dispersion (hereinafter, simply referred to as "a solution") prior to the use thereof. The organic solvent may include, for example, N,N-dimethylacetamide, methyl ethyl ketone, N,N-dimethylformamide, cyclohexanone, cyclopentanone, N-methyl-2-pyrrolidone, toluene, methanol, ethanol, isopropanol, acetone, propylene glycol monomethyl ether, and propylene glycol monomethyl ether acetate; preferably methyl ethyl ketone, cyclopentanone, propylene glycol monomethyl ether, and propylene glycol monomethyl ether acetate. These organic solvent may be used alone, or in combination of two or more kinds.

<Resin Film>

It is preferable that the inventive resin composition be formed into a film-like form. Such a resin film made from the inventive resin composition has a good molding properties to wafers, particularly to a thin-film wafer having a large diameter. It is not necessary to flow the resin when a wafer is molded in a lump. Accordingly, it is possible to basically solve the problems such as wire transformation and a short shot on a wafer surface, which can be caused in previous transfer molding, and difficulty in controlling the extent of molding as well as fluidity and properties of liquid sealing resin, which can be caused in compression molding.

The thickness of the resin film is not particularly limited, and preferably 50 μm or more and 1,000 μm or less, more preferably 80 μm or more and 700 μm or less. In such a thickness, the resin film becomes more excellent in low-warping properties and wafer protection performance.

Accordingly, the present invention provides a resin film made from the resin composition by film formation. Such a resin film is provided in a form of a resin film with a protective layer which comprises the resin film and the protective layer to cover the resin film, for example. The protective layer can be the ones described below. Hereinafter, an example of the inventive method for producing a resin film will be described.

(Production Method of Resin Film)

The resin film made from the inventive resin composition can be obtained in such a way that the raw materials of the present invention, comprising (A) the silicone resin, (B) the epoxy resin-curing agent, (C) the filler, and other optional components (including organic solvent) in accordance with needs, are mixed to form a liquid state to prepare a resin composition solution in advance; the resin composition solution is applied onto a protective layer (a delamination film) by using a reverse-roll coater, a comma coater, etc.; the protective layer coated with the resin composition solution is passed through an inline drier to remove the organic solvent to dry the layer at 80 to 160° C. for 2 to 20 minutes, and then compressed to another protective layer (a protective film) by using a roll laminator to be laminated.

In the present invention, the "delamination film" is a film to be coated with the inventive resin composition, and refers to the one subsequently delaminated from a resin composition layer formed from the inventive resin composition. The "protective film" refers to a film to cover the resin composition layer formed on the delaminated film in order to protect the resin layer.

The compressing condition is not particularly limited. However, it is preferable to laminate them at a temperature of 50 to 100° C., a linear pressure of 0.5 to 5 kgf/cm, and a rate of 0.1 to 5 m/min.

As another embodiment, the inventive resin composition can be applied onto a delamination film to produce two or more resin-formed films each having a resin composition layer on the delamination film, followed by superimposing the resin composition layers of the two or more resin-formed films with each other to produce a composite resin film composed of multiple layers.

In this case, it is preferable that at least one of the resin-formed films have a protective film for protecting the resin composition layer in such a way that the resin composition layer and the protective film are successively formed on the delamination film, and the superimposing of the resin composition layers of the resin-formed films be performed such that the protective film or the delamination film is removed from each of the resin-formed films so as to expose the resin composition layer to be laminated with each other, and the exposed resin composition layers are superimposed with each other.

As described above, the resin-formed film, that is, a laminate composed of a protective layer (delamination film)/ a resin film/a protective layer (protective film) can give a resin film in which 2 or more resin layers are directly laminated by removing either protective layer and adhering the remaining laminates, each comprising the resin film/the protective layer, with each other. This can be repeated to give a laminate composed of multiple layers of the resin films. In the present invention, the resin film composed of 2 to 4 layers is preferable. In the lamination, it is preferable to laminate the films with each other while heating to 30 to 120° C.

Protective Film/Delamination Film (Protective Layer)

Any of the protective film to protect the resin film (resin composition layer) and the delamination film to be coated with the resin composition solution is not particularly limited so long as it can be delaminated from the resin film composed of the inventive resin composition without impairing the shape of the resin film. This is utilized as a protective film for a wafer or a delamination film. For example, there may be used plastic films such as a polyethylene (PE) film, a polypropylene (PP) film, a polymethylpentene (TPX) film, and a polyester film subjected to releasing treatment. This preferably has a peel strength of 50 to 300 mN/min and a thickness of 25 to 100 μm, more preferably 38 to 75 μm.

(Wafer to be Molded)

A wafer to be molded with the inventive resin film in a lump is not particularly limited, and may be a wafer having a semiconductor device (a chip) mounted on a surface thereof or a semiconductor wafer having a semiconductor device fabricated on a surface thereof. The inventive resin film has a good loading property onto such wafer surfaces before molding, and has low-warping properties after molding, thereby being excellent in protection performance to such wafers. The inventive resin film can be favorably used for molding a large diameter wafer with a diameter of 8 inches (200 mm) or more such as 8 inches (200 mm) or 12 inches (300 mm) or a thin-film wafer, although the use is not particularly limited. As the thin-film wafer to be molded, it is preferable to use a wafer processed to a thin type with a thickness of 5 to 300 μm.

(Wafer Molding Method)

The method for molding a wafer by using the inventive resin film is not particularly limited. Illustrative examples thereof include a method shown in FIG. 1 in which one of the protective layer adhered on the resin film is delaminated, and Resin film 1 is attached while being fitted to the circuit area so as to mold the circuit surface of Wafer 2 (FIG. 1 (A)), and a method in which the resin film is adhered onto Wafer 2 in a lump so as to cover Wafer 2 entirely (FIG. 1(B)). For example, this can be performed by adhering the resin film, having the other protective layer adhered thereto, closely onto the wafer in a lump by using a vacuum laminator manufactured by Takatori Corporation (a product name: TEAM-100RF), setting a degree of vacuum in the vacuum chamber to 50 to 1,000 Pa, preferably 50 to 500 Pa, e.g., 100 Pa at 80 to 200° C., preferably 80 to 130° C., e.g., 100° C.; restoring the pressure to a normal pressure; then cooling the wafer to room temperature to be taken out from the vacuum laminator, and delaminating the other protective layer. Subsequently, the resin film can be heat cured under the conditions of 120 to 220° C. for 15 to 180 minutes.

<Semiconductor Device>

The present invention also provides a semiconductor device with a heat cured film in which a semiconductor wafer is molded with the heat cured film of the foregoing resin film and divided into individual pieces. The molded wafer is attached onto a protective tape for semiconductor processing such as dicing tape so as to be in contact with a molding resin surface or a wafer surface, and placed on a vacuum chuck table of a dicer. This molded wafer is cut by using a dicing saw (e.g., DFD6361, product of DISCO Corp.) provided with a dicing blade. The spindle rotation rate and cutting speed of dicing operation may be selected appropriately, and the spindle rotation rate is generally 25,000 to 45,000 rpm, and the cutting speed is generally 10 to 50 mm/sec. The size of a division piece is generally 2 mm×2 mm to 30 mm×30 mm, although it depends on a semiconductor package design.

The inventive semiconductor device, which is obtained by dicing a sufficiently protected wafer having reduced warpage into individual pieces with a dicing blade and so on, can be a high quality semiconductor device in high yield.

<Production Method of Semiconductor Device>

The present invention also provides a method for producing a semiconductor device, comprising the steps of: adhering the inventive resin film to a semiconductor wafer to mold the semiconductor wafer with the resin film, and dividing the molded semiconductor wafer into individual pieces.

Specific examples thereof include a method which comprises delaminating a protective layer on one side of a resin film having protective layers formed on both of the surfaces from the resin film, adhering the exposed resin film to the surface of a semiconductor wafer, delaminating the protective layer on the other side from the resin film, molding the semiconductor wafer with the resin film, and dividing the molded semiconductor wafer into individual pieces.

EXAMPLES

Hereinafter, the present invention will be explained more specifically by showing Synthesis Examples, Examples, and Comparative Examples, but the present invention is not limited to the following Examples.

In the following Synthesis Examples, the weight average molecular weight of each polymer was measured by gel permeation chromatography (GPC) in terms of monodispersed polystyrene as a standard by using a GPC column of TSK gel Super HZM-H (product of Tosoh Corporation) under analysis conditions of a flow rate of 0.6 ml/min, an eluting solvent of tetrahydrofuran, and a column temperature of 40° C.

Compounds to be used in Synthesis Examples and Comparative Synthesis Examples are shown below.

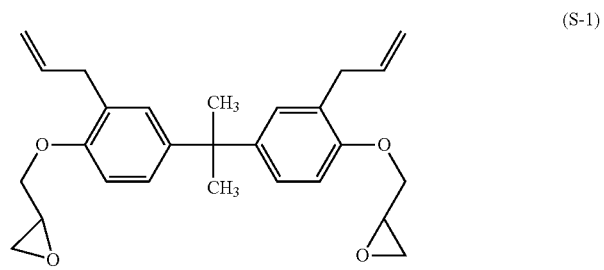

(S-1)

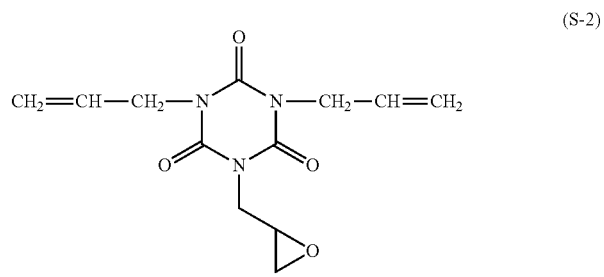

(S-2)

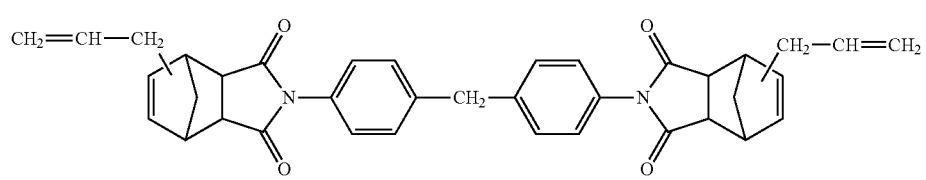

(S-3)

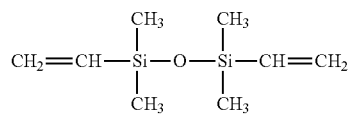

(S-4: Shin-Etsu Chemical Co., Ltd.)

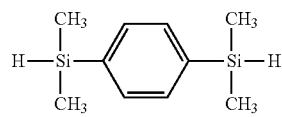

(S-5: Shin-Etsu Chemical Co., Ltd.)

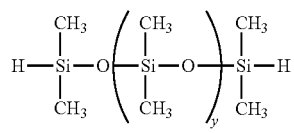

(S-6: Shin-Etsu Chemical Co., Ltd.)

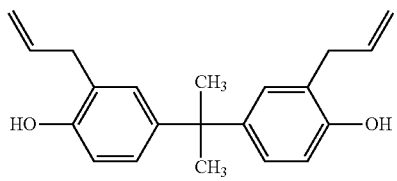

Synthesis Example 1

Into a 3 L flask equipped with a stirrer, a thermometer, a nitrogen inflow instrument, and a reflux condenser, 84.1 g (0.20 mol) of a compound shown by the formula (S-1), 66.3 g (0.25 mol) of a compound shown by the formula (S-2), and 28.5 g (0.05 mol) of a compound shown by the formula (S-3) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.3 g (0.30 mol) of a compound shown by the formula (S-5) and 553 g (0.20 mol) of a compound shown by the formula (S-6) (y=40) were added dropwise over 1 hour (total molar number of the hydrosilyl groups/total molar number of the alkenyl groups=1/1, silicone content: 70.0% by mass; when the molar number "e" of S-3 was assumed to be 1, the molar number "c" of S-1 and the molar number "d" of S-2 satisfied c+d=9, and the molar number "f" of S-4 was f=0). After completion of the dropwise addition, the mixture was heated to 100° C. and aged for 6 hours. Then, toluene was evaporated from the reaction solution under reduced pressure to give a product with a weight average molecular weight of 45,000 measured by GPC in terms of polystyrene. The obtained resin was defined as Resin (1), and was used for Examples and Comparative Examples.

Synthesis Example 2

Into a 3 L flask equipped with a stirrer, a thermometer, a nitrogen inflow instrument, and a reflux condenser, 44.1 g (0.167 mol) of a compound shown by the formula (S-2), 94.9 g (0.167 mol) of a compound shown by the formula (S-3), and 31.0 g (0.167 mol) of a compound shown by the formula (S-4) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.3 g (0.30 mol) of a compound shown by the formula (S-5) and 141 g (0.20 mol) of a compound shown by the formula (S-6) (y=10) were added dropwise over 1 hour (total molar number of the hydrosilyl groups/total molar number of the alkenyl groups=1/1, silicone content: 46.6% by mass; when the molar number "e" of S-3 was assumed to be 1, c+d=1, and f=1). After completion of the dropwise addition, the mixture was heated to 100° C. and aged for 6 hours. Then, toluene was evaporated from the reaction solution under reduced pressure to give a product with a weight average molecular weight of 41,000 measured by GPC in terms of polystyrene. The obtained resin was defined as Resin (2), and was used for Examples.

Synthesis Example 3

Into a 3 L flask equipped with a stirrer, a thermometer, a nitrogen inflow instrument, and a reflux condenser, 84.1 g (0.20 mol) of a compound shown by the formula (S-1), 53.0 g (0.20 mol) of a compound shown by the formula (S-2), 28.5 g (0.05 mol) of a compound shown by the formula (S-3), and 9.3 g (0.05 mol) of a compound shown by the formula (S-4) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.3 g (0.30 mol) of a compound shown by the formula (S-5) and 317 g (0.20 mol) of a compound shown by the formula (S-6) (y=20) were added dropwise over 1 hour (total molar number of the hydrosilyl groups/total molar number of the alkenyl groups=1/1, silicone content: 59.3% by mass; when the molar number "e" of S-3 was assumed to be 1, c+d=8, and f=1). After completion of the dropwise addition, the mixture was heated to 100° C. and aged for 6 hours. Then, toluene was evaporated from the reaction solution under reduced pressure to give a product with a weight average molecular weight of 43,000 measured by GPC in terms of polystyrene. The obtained resin was defined as Resin (3), and was used for Examples.

Synthesis Example 4

Into a 3 L flask equipped with a stirrer, a thermometer, a nitrogen inflow instrument, and a reflux condenser, 66.3 g (0.25 mol) of a compound shown by the formula (S-2) and 143 g (0.25 mol) of a compound shown by the formula (S-3) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.3 g (0.30 mol) of a compound shown by the formula (S-5) and 553 g (0.20 mol) of a compound shown by the formula (S-6) (y=40) were added dropwise over 1 hour (total molar number of the hydrosilyl groups/total molar number of the alkenyl groups=1/1, silicone content: 67.4% by mass; when the molar number "e" of S-3 was assumed to be 1, c+d=1, and f=0). After completion of the dropwise addition, the mixture was heated to 100° C. and aged for 6 hours. Then, toluene was evaporated from the reaction solution under reduced pressure to give a product with a weight average molecular weight of 39,000 measured by GPC in terms of polystyrene. The obtained resin was defined as Resin (4), and was used for Examples.

Comparative Synthesis Example 1

Into a 3 L flask equipped with a stirrer, a thermometer, a nitrogen inflow instrument, and a reflux condenser, 210 g (0.50 mol) of a compound shown by the formula (S-1) was introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.3 g (0.30 mol) of a compound shown by the formula (S-5) and 553 g (0.20 mol) of a compound shown by the formula (S-6) (y=40) were added dropwise over 1 hour (total molar number of the hydrosilyl groups/total molar number of the alkenyl groups=1/1, silicone content: 67.3% by mass; the molar number "e" of S-3 was such that e=0 since S-3 was not contained). After completion of the dropwise addition, the mixture was heated to 100° C. and aged for 6 hours. Then, toluene was evaporated from the reaction solution under reduced pressure to give a product with a weight average molecular weight of 42,000 measured by GPC in terms of polystyrene. The obtained resin was defined as Resin (5), and was used for Comparative Examples.

Comparative Synthesis Example 2

Into a 3 L flask equipped with a stirrer, a thermometer, a nitrogen inflow instrument, and a reflux condenser, 28.5 g (0.05 mol) of a compound shown by the formula (S-3) and 194 g (0.45 mol) of a compound shown by the formula (S-7) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.3 g (0.30 mol) of a compound shown by the formula (S-5) and 553 g (0.20 mol) of a compound shown by the formula (S-6) (y=40) were added dropwise over 1 hour (total molar number of the hydrosilyl groups/total molar number of the alkenyl groups=1/1, silicone content: 66.4% by mass; when the molar number "e" of S-3 was assumed to be 1, c+d=0, and f=0). After completion of the dropwise addition, the mixture was heated to 100° C. and aged for 6 hours. Then, toluene was evaporated from the reaction solution under reduced pressure to give a product with a weight average molecular weight of 45,000 measured by GPC in terms of polystyrene. The obtained resin was defined as Resin (6), and was used for Comparative Examples.

Preparation of Resin Composition

Examples 1-1 to 1-6

With the compositions shown in Table 1 below, (A) each silicone resin synthesized in the foregoing Synthesis Examples 1 to 4 (Resins (1) to (4)), (B) the epoxy resin-curing agent, the epoxy resin-curing accelerator, (C) the filler, and the optional component were formulated. Further, cyclopentanone was added with an amount so that the concentration of the solid components became 75% by mass, the mixture was stirred by using a ball mill, mixed and dissolved to prepare a dispersion of a resin composition (Examples 1-1 to 1-6). The unit of the numerals showing the formulation amount in Table 1 is "parts by mass".

Comparative Examples 1-1 to 1-3

Comparative Example 1-1 employed a resin composition containing a silicone resin (Resin (5)) which was different from (A) the silicone resin in the present invention, without containing an essential unit (the unit shown by the formula (4)) of (A) the silicone resin in the present invention, which did not satisfy the requirement of the present invention. Comparative Example 1-2 employed a resin composition containing a silicone resin (Resin (6)) which was different from (A) the silicone resin in the present invention, which did not satisfy the requirement of the present invention. Comparative Example 1-3 employed a resin composition containing (A) the silicone resin in the present invention, but not containing (C) the filler, which did not satisfy the requirement of the present invention.

Each component used for preparation of the resin composition is shown below.
(B) Epoxy Resin-Curing Agent
Phenolite TD-2093 (product of DIC CORPORATION, phenolic novolak resin, OH equivalent: 98 to 102)
RIKACID HH (trade name) (product of New Japan Chemical Co., Ltd., hexahydrophthalic anhydride, molecular weight: 154)
Moreover, the epoxy resin-curing accelerator shown below was used.
Curezol 2P4MHZ (trade name) (product of Shikoku Chemical Corporation, 2-phenyl-4-methyl-5-hydroxymethylimidazole)
(C) Filler
Silica (product of Admatechs Co., Ltd., average particle size: 5.0 μm)
Other Component
EOCN-103S (trade name) (product of Nippon Kayaku Co., Ltd., epoxy resin, epoxy equivalent: 209 to 219)
Herein, the epoxy equivalent refers to the equivalent amount of epoxy groups per molecule of each component.

TABLE 1

|  |  | Examples |  |  |  |  |  | Comparative Examples |  |  |
|---|---|---|---|---|---|---|---|---|---|---|
|  |  | 1-1 | 1-2 | 1-3 | 1-4 | 1-5 | 1-6 | 1-1 | 1-2 | 1-3 |
| (A) Silicone resin | Resin (1) | 100 |  |  |  |  | 100 |  |  | 100 |
|  | Resin (2) |  | 100 |  |  |  |  |  |  |  |
|  | Resin (3) |  |  | 100 |  |  |  |  |  |  |
|  | Resin (4) |  |  |  | 100 | 100 |  |  |  |  |
| Silicone resin out of this invention | Resin (5) |  |  |  |  |  |  | 100 |  |  |
|  | Resin (6) |  |  |  |  |  |  |  | 100 |  |
| (B) Epoxy resin curing agent | Phenolite TD-2093 | 9 |  | 24 | 15 | 15 |  | 13 |  | 9 |
|  | RIKACID HH |  | 12 |  |  |  | 15 |  |  |  |
| Epoxy resin-curing accelerator | Curezol 2P4MHZ | 1 | 1 | 1 | 1 | 1 | 1 | 1 | 1 | 1 |

TABLE 1-continued

| | | Examples | | | | | | Comparative Examples | | |
|---|---|---|---|---|---|---|---|---|---|---|
| | | 1-1 | 1-2 | 1-3 | 1-4 | 1-5 | 1-6 | 1-1 | 1-2 | 1-3 |
| (C) Filler | Silica | 500 | 800 | 1000 | 1600 | 1600 | 1600 | 500 | 500 | |
| Other component | EOCN-103s | | 25 | 25 | 25 | 25 | 25 | | 23 | |
| Thickness of resin film [μm] | | 200 | 200 | 200 | 200 | 500 | 200 | 200 | 200 | 200 |

[Production of Resin Film]

The delamination films and protective film used for producing the resin films are shown below.

Delamination film (1): E7304 (polyester manufactured by Toyobo Co., Ltd., thickness: 75 peel strength: 200 mN/50 mm)

Delamination film (2): E7302 (polyester manufactured by Toyobo Co., Ltd., thickness: 75 μm, peel strength: 90 mN/50 mm)

Protective film: polyethylene film (thickness: 100 μm)

Example 2-1

The resin composition shown in Example 1-1 of Table 1 was applied onto a delamination film using a die coater as a film coater and the foregoing E7304 (Delamination film (1)) as the delamination film. Then, this was passed through a hot air circulating oven (length: 4 m) set to 100° C. for 5 minutes to form a resin film with a thickness of 100 μm on the Delamination film (1).

Then, polyethylene film (thickness: 100 μm) was adhered on the resin film by using a laminating roll at a linear pressure of 10 N/cm to produce Laminated film (1) composed of Delamination film (1)/resin film/Protective film.

Laminated film (2) composed of Delamination film (2)/resin film/Protective film was also produced by the same procedure as described above except that the foregoing E7302 (Delamination film (2)) instead of Delamination film (1) was used as the delamination film.

The polyethylene film (protective film) was removed from each of the obtained Laminated films (1) and (2). The resin films were superimposed with each other, and introduced into a hot roll laminator heated to 60° C. to produce a composite film composed of Delamination film (1)/resin film/Delamination film (2) with the resin film having a film thickness of 200 μm.

Examples 2-2 to 2-6, Comparative Examples 2-1 to 2-3

Composite films each having a resin film with a film thickness of 200 μm were prepared in the same manner as Example 2-1 by using resin compositions prepared in Examples 1-2 to 1-4, Example 1-6, and Comparative Examples 1-1 to 1-3 (Examples 2-2 to 2-4, Example 2-6, and Comparative Examples 2-1 to 2-3). In Example 2-5, a resin film with a film thickness of 500 μm was produced by using the resin composition of Example 1-5, which is the same resin composition as Example 1-4.

[Molding of Resin Film to Wafer]

A silicon wafer with a wafer thickness of 100 μm and a diameter of 12 inches (300 mm) was prepared. From each composite films produced in Examples 2-1 to 2-6 and Comparative Examples 2-1 to 2-3, Delamination film (2) was delaminated. The resin film was adhered to the silicon wafer in a lump at 110° C. by using a vacuum laminator (product of Takatori Corporation, trade name: TEAM-300M) and setting the vacuum chamber to have a pressure of 250 Pa. After the chamber pressure had been returned to normal pressure, the silicon wafer was cooled to 25° C. to be taken out from the vacuum laminator, and remaining Delamination film (1) was delaminated. The obtained wafer with resin film was subjected to heating at 180° C. for 2 hours in an inert oven to cure the resin.

[Evaluation 1: Warpage Amount of Wafer]

The wafer after curing the resin film was subjected to laser measurement with FLX-3300-T (product of Toho Technology Corporation) to measure a warpage amount of wafer. The obtained values are shown in Table 2. It is to be noted that when the warpage amount was too large to be measured with this apparatus, the value measured with a ruler (JIS first class) is described.

[Evaluation 2: Wafer Supporting Ability]

Wafer supporting ability was evaluated by measuring the deflection of the wafer when an end of the wafer was supported. The ability was evaluated "good" when the deflection was within 20 mm, and "bad" when the deflection exceeded 20 mm. The results are shown in Table 2.

[Evaluation 3: Adhesion Strength]

Each resin film was adhered on a semiconductor wafer with a diameter of 6-inch (150 mm) (thickness: 625 μm, product of Shin-Etsu Chemical Co., Ltd.) using a vacuum film laminator (temperature: 100° C., pressure: 100 Pa, TEAM-100, product of Takatori Corporation). Then, this was cut into a size of 2 mm×2 mm square by using a dicing saw (DAD685, product of DISCO CORPORATION) equipped with a dicing blade. The chip in a 2 mm×2 mm square was attached onto a silicon wafer (base substrate) in a 15 mm×15 mm square, which was prepared, via the resin film at 150° C. under the load of 50 mN. Then, this was heated at 180° C. for 2 hours to cure the resin film to give a test piece. Each 5 pieces of the test pieces were produced, and served to the following test for measuring an adhesion strength.

By using a bond tester (Dage series 4000-PXY: product of Dage Co., Ltd.) to measure resistance imposed when the semiconductor chip (2 mm×2 mm) wad delaminated from the base substrate (silicon wafer in a 15 mm×15 mm square) to evaluate the adhesion strength of the resin film layer. The test was carried out under the conditions of a test speed of 200 μm/sec and a test height of 50 μm. The results are shown in Table 2. Each of the values shown in Table 2 is an average of measured values on the 5 test pieces, and the higher value means higher adhesion strength of the adhered sheet.

[Evaluation 4: Reliability]

The wafer with the cured resin film was cut to give a test piece in 10 mm×10 mm square by using a dicing saw (DAD685, product of DISCO CORPORATION, spindle rotation speed: 40,000 rpm, cutting rate: 20 mm/sec)

equipped with a dicing blade. The obtained test pieces (10 pieces for each) were applied to a heat cycle test (repeated 1000 cycles of holding at −25° C. for 10 minutes and holding at 125° C. for 10 minutes) to determine the state of peeling of the resin film from the wafer after the heat cycle test. The example which showed no peeling was judged as "Good", and the example in which at least one test piece showed peeling was judged as "Bad". The results are shown in Table 2.

[Evaluation 5: Heat Resistance]

On the test piece produced in Evaluation 4, the weight before testing was measured. Subsequently, the test piece was left in an oven heated to 200° C. for 1000 hours. Then, the test piece was taken out from the oven, and the weight after testing was measured. The example in which the weight change was less than 0.5% by mass before and after the testing was judged as "Good", and the example in which the weight change was 0.5% by mass or more before and after the testing was judged as "Bad". The results are shown in Table 2.

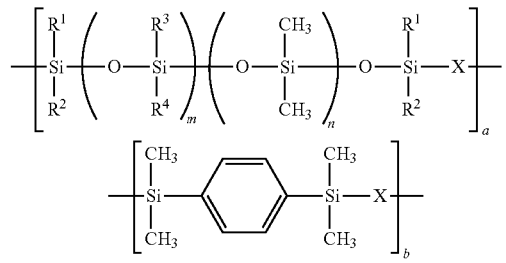

(1)

TABLE 2

| Evaluation items | Examples | | | | | | Comparative Examples | | |
|---|---|---|---|---|---|---|---|---|---|
| | 2-1 | 2-2 | 2-3 | 2-4 | 2-5 | 2-6 | 2-1 | 2-2 | 2-3 |
| Warpage amount [mm] | ≤1 | ≤1 | ≤1 | ≤1 | ≤1 | ≤1 | ≤1 | 47 | 35 |
| Wafer supporting ability | Good | Good | Good | Good | Good | Good | Good | Bad | Bad |
| Adhesion strength [MPa] | 29.5 | 30.2 | 28.8 | 30.5 | 30.5 | 29.8 | 27.4 | 25.6 | 27.0 |
| Reliability | Good | Good | Good | Good | Good | Good | Good | Bad | Bad |
| Heat resistance | Good | Good | Good | Good | Good | Good | Bad | Bad | Bad |

From the foregoing results, it was found that the resin films obtained from the inventive resin compositions (Examples 2-1 to 2-6) showed lower warpage amount of a wafer and were superior in wafer supporting ability, adhesion properties, reliability, and heat resistance compared to the resin films of Comparative Examples 2-1 to 2-3.

As described above, it was revealed that the inventive resin composition can be formed into a film-like form, and accordingly, it can mold a wafer (wafer molding) in a lump and has good molding properties particularly to a thin-film wafer having a large diameter. It was also revealed that the resin film obtained from the inventive resin composition is excellent in low-warping properties and wafer protection performance, as well as adhesion properties, reliability, and heat resistance.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A resin composition comprising:
(A) a silicone resin containing a constitutional unit shown by the following composition formula (1) and having a weight average molecular weight of 3,000 to 500,000, wherein $R^1$ to $R^4$ each independently represent a monovalent hydrocarbon group having 1 to 8 carbon atoms, with the proviso that the both of $R^3$ and $R^4$ are not methyl groups at the same time; "m" and "n" are each independently an integer of 0 to 300; the both of "a" and "b" are positive numbers satisfying a+b=1; each of "X" independently represents a linking group selected from the divalent groups shown by the following general formulae (2), (3), (4), and (5), and the molar numbers of units shown by said general formulae (2), (3), (4), and (5) contained in the silicone resin (A) are defined as "c", "d", "e", and "f" respectively, "e" is a positive number, each of "c", "d", and "f" is 0 or a positive number satisfying c+d+e+f/the molar number of the linking group shown by "X" contained in the silicone resin (A)=1, and having a ratio to "e" in a range of c+d=1 to 10 and f=0 to 1 when the "e" is assumed to be 1;

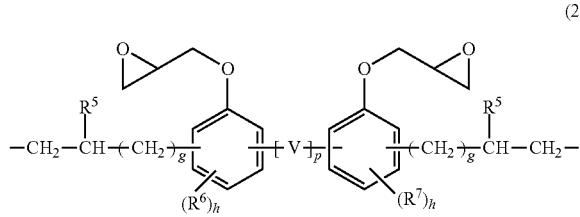

(2)

wherein "V" is a divalent organic group selected from the following

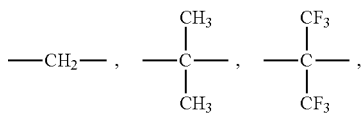

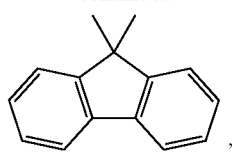

"p" is 0 or 1, $R^5$ represents a hydrogen atom or a methyl group, "g" is an integer of 0 to 7, $R^6$ and $R^7$ each independently represent the same or different group selected from alkyl groups and alkoxy groups having 1 to 4 carbon atoms, and "h" is any of 0, 1, and 2, (3)

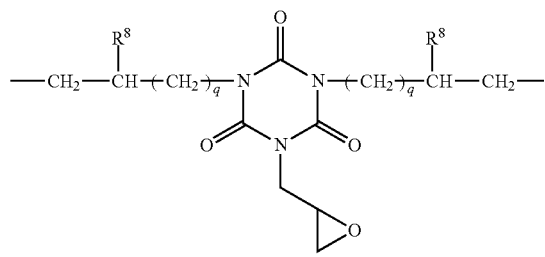

wherein $R^8$ represents a hydrogen atom or a methyl group, and "q" is an integer of 0 to 7, (4)

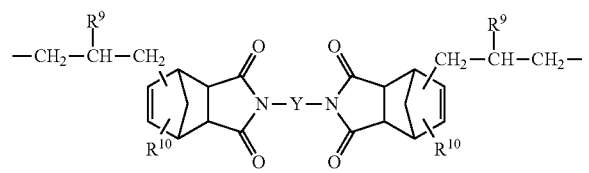

wherein "Y" is a divalent group selected from the following

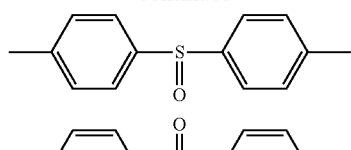

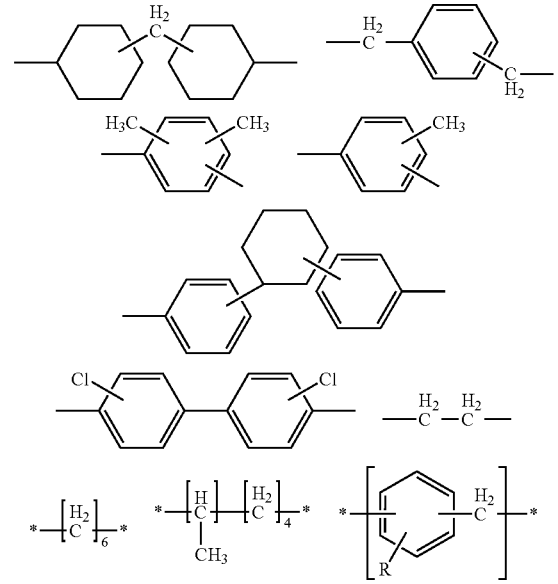

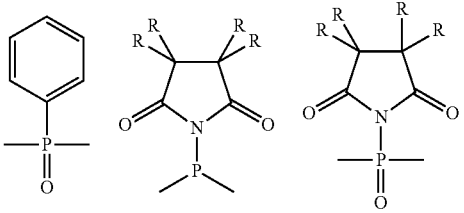

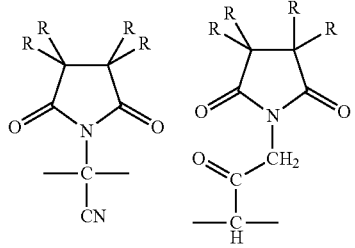

wherein "R" each independently represent a hydrogen atom or a methyl group, and $R^9$ and $R^{10}$ each independently represent a hydrogen atom or a methyl group,

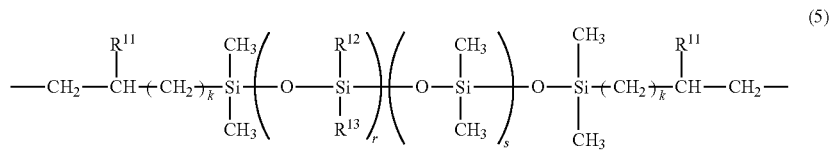

(5)

wherein $R^{12}$ and $R^{13}$ each independently represent a monovalent hydrocarbon group having 1 to 8 carbon atoms, with the proviso that the both of $R^{12}$ and $R^{13}$ are not methyl groups at the same time, "r" and "s" are each independently an integer of 0 to 300, $R^{11}$ represents a hydrogen atom or a methyl group, and "k" is an integer of 0 to 7;

(B) an epoxy resin-curing agent; and (C) a filler.

2. The resin composition according to claim 1, wherein the "Y" is a divalent group selected from the following

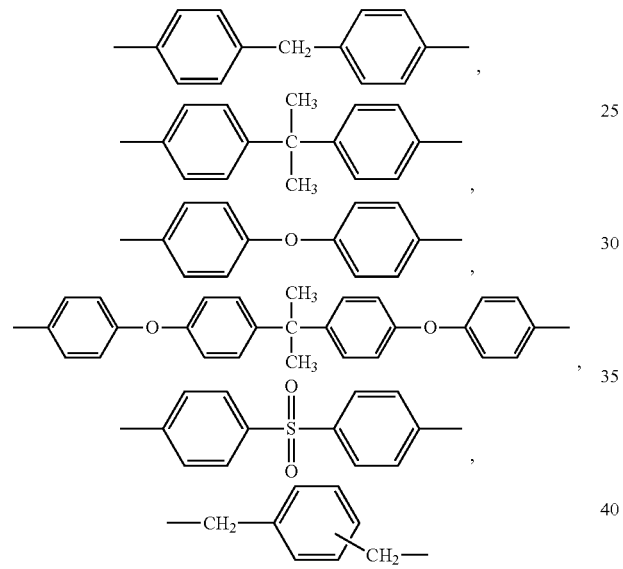

in the general formula (4).

3. The resin composition according to claim 1, wherein the component (B) is any of an amine-based epoxy resin-curing agent, a phenol-based epoxy resin-curing agent, and an acid anhydride-based epoxy resin-curing agent.

4. The resin composition according to claim 2, wherein the component (B) is any of an amine-based epoxy resin-curing agent, a phenol-based epoxy resin-curing agent, and an acid anhydride-based epoxy resin-curing agent.

5. The resin composition according to claim 1, wherein the amount of the component (B) is 5 to 50 parts by mass based on 100 parts by mass of the component (A), and the mass fraction of the component (C) is 50 to 95% by mass based on the total mass.

6. The resin composition according to claim 2, wherein the amount of the component (B) is 5 to 50 parts by mass based on 100 parts by mass of the component (A), and the mass fraction of the component (C) is 50 to 95% by mass based on the total mass.

7. The resin composition according to claim 3, wherein the amount of the component (B) is 5 to 50 parts by mass based on 100 parts by mass of the component (A), and the mass fraction of the component (C) is 50 to 95% by mass based on the total mass.

8. The resin composition according to claim 4, wherein the amount of the component (B) is 5 to 50 parts by mass based on 100 parts by mass of the component (A), and the mass fraction of the component (C) is 50 to 95% by mass based on the total mass.

9. The resin composition according to claim 1, further comprising an epoxy resin-curing accelerator.

10. The resin composition according to claim 1, further comprising an epoxy resin other than the component (A).

11. The resin composition according to claim 1, wherein the component (C) is silica.

12. The resin composition according to claim 2, wherein the component (C) is silica.

13. A resin film made from the resin composition according to claim 1.

14. A resin film made from the resin composition according to claim 2.

15. A method for producing a resin film comprising:
coating a delamination film with the resin composition according to claim 1 to produce two or more resin-formed films each having a resin composition layer on the delamination film, and
superimposing the resin composition layers of the two or more resin-formed films with each other.

16. A method for producing a resin film comprising:
coating a delamination film with the resin composition according to claim 2 to produce two or more resin-formed films each having a resin composition layer on the delamination film, and
superimposing the resin composition layers of the two or more resin-formed films with each other.

17. The method for producing a resin film according to claim 15,
wherein at least one of the resin-formed films has a protective film for protecting the resin composition layer in such a way that the resin composition layer and the protective film are successively formed on the delamination film, and
the superimposing of the resin composition layers of the resin-formed films is performed such that the protective film or the delamination film is removed from each of the resin-formed films so as to expose the resin composition layer to be laminated with each other, and the exposed resin composition layers are superimposed with each other.

18. A method for producing a semiconductor device, comprising the steps of:
adhering the resin film according to claim 13 to a semiconductor wafer to mold the semiconductor wafer with the resin film, and
dividing the molded semiconductor wafer into individual pieces.

19. A semiconductor device, wherein the device is a division piece of a semiconductor wafer molded with a heat cured film of the resin film according to claim 13.

* * * * *